United States Patent [19]

Honda et al.

[11] Patent Number: 5,295,331
[45] Date of Patent: Mar. 22, 1994

[54] METHOD OF CHAMFERING SEMICONDUCTOR WAFER

[75] Inventors: Katsuo Honda; Yoshio Kamoshita; Shinji Shibaoka; Katsuhiro Tago, all of Mitaka, Japan

[73] Assignee: Tokyo Seimitsu Co., Ltd., Tokyo, Japan

[21] Appl. No.: 977,889

[22] Filed: Nov. 18, 1992

[30] Foreign Application Priority Data

Nov. 28, 1991 [JP] Japan .................................. 3-314755
Dec. 12, 1991 [JP] Japan .................................. 3-329141

[51] Int. Cl.$^5$ ............................. B24B 9/06; B24B 1/00
[52] U.S. Cl. ................................ 51/283 E; 51/165.71
[58] Field of Search ............ 51/283 E, 284 E, 281 R, 51/165.71; 125/13.01

[56] References Cited

U.S. PATENT DOCUMENTS

| 4,344,260 | 8/1982 | Ogiwara | 51/283 E |
| 4,594,814 | 6/1986 | Olszewski et al. | 51/283 E |
| 4,638,601 | 1/1987 | Steere et al. | 51/165.81 |
| 4,793,101 | 12/1988 | Dloughy | 51/283 E |
| 4,793,102 | 12/1988 | Dloughy | 51/283 E |

FOREIGN PATENT DOCUMENTS

| 59-214554 | 12/1984 | Japan . | |
| 1542785 | 2/1990 | U.S.S.R. | 51/283 E |
| 2126008 | 3/1984 | United Kingdom | 51/283 E |

Primary Examiner—Robert A. Rose
Attorney, Agent, or Firm—Oliff & Berridge

[57] ABSTRACT

According to the present invention, the rotary axis O—O of a grindstone 22 is inclined to the rotary axis P—P of a semiconductor wafer 20 through an angle $\theta$ in a direction of the tangent line of the semiconductor wafer. Accordingly, a moving direction of abrasive grains of the grindstone 22 is divided into two including a component force $A_1$ in the grinding direction and a component force $A_2$ in the perpendicular direction, and these component forces increase the number of acting abrasive grains, so that the accuracy of the chamfering shape and the surface roughness can be improved. According to the present invention, the peripheral edge of the rotating semiconductor wafer is chamfered while the rotating grindstone 22 is reciprocatingly moved along the inclined grinding surface 24, whereby the number of the acting abrasive grains are increased, so that the accuracy of the chamfering shape and the surface roughness can be improved.

4 Claims, 6 Drawing Sheets

METHOD OF CHAMFERING SEMICONDUCTOR WAFER

BACKGROUND OF THE INVENTION

1. Field of the invention

This invention relates to a method of chamfering a semiconductor wafer, and more particularly to a method of chamfering a semiconductor wafer, wherein a rotating grindstone is abutted against the peripheral edge of the rotating semiconductor wafer for grinding the peripheral edge of the semiconductor wafer.

2. Description of the Related Art

In the semiconductor wafer cut by slicing, the surface thereof is subjected to lapping and the peripheral edge thereof is chamfered to prevent cracking of the wafer and to prevent dust from adhering to the wafer. That is, as shown in FIG. 9, an inclined surface 14 of a rotating grindstone 12 with a groove is urged against a rotating semiconductor wafer 10 to chamfer the peripheral edges 16 and 17 of the semiconductor wafer.

However, according to the conventional method of chamfering the semiconductor wafer, as shown in FIG. 9, the moving direction A of an abrasive grain 15 is limited to the circumferential direction of the wafer, whereby a streak A' is formed on a chamfered surface by the abrasive grain (partial cutting edge), so that the surface roughness accuracy of the chamfered surface is not satisfactory. When the surface roughness accuracy of the chamfered surface is unsatisfactory, the dust adheres to the peripheral edge surface where chips due to partial cracks on the peripheral edge surface of the wafer are formed. Further, there is a factor of producing the dust due to crouching of fine particles between the cracks, so that an adverse influence is rendered to the post-treatment process of the wafer. In order to obviate this drawback, the count number of the grindstone is raised, the cut-in amount is decreased, the number of times of dressing is increased and several grindstones are exchanged (at two stages, three stages and so forth) to raise the surface roughness accuracy of the ground surface, however, these counter measures present a disadvantage of lowering the grinding efficiency.

SUMMARY OF THE INVENTION

The present invention has been developed to obviate the above-described disadvantages and has its object the proposal of a method of chamfering a semiconductor wafer, wherein the surface roughness accuracy of the chamfered surface is improved and the grinding efficiency is not lowered.

To achieve the above-described object, the present invention is characterized in that, in a method of chamfering a semiconductor wafer, wherein a rotating grindstone is abutted against the peripheral edge of a rotating semiconductor wafer to grind the peripheral edge of the semiconductor wafer, the rotary axis of the grindstone is inclined to a direction of the tangent line of the semiconductor wafer for grinding the peripheral edge of the semiconductor wafer.

According to the present invention, the rotary axis of the grindstone is inclined to the direction of the tangent line of the semiconductor wafer with the respect to the rotary axis of the semiconductor wafer for grinding the peripheral edge of the semiconductor wafer, whereby the movement of the grindstone is applied to the radial direction of the wafer in the inclined surface, and simultaneously, the movement of the grindstone is applied to the rotating direction of the wafer in the outer peripheral surface, so that the ground surface of the peripheral edge of the semiconductor wafer becomes smooth and deformation of the grinding surface of the grindstone itself is reduced, to thereby extend the service life of the grindstone.

To achieve the above-described object, the present invention is characterized in that, in the method of chamfering the semiconductor wafer, wherein the rotating grindstone is abutted against the peripheral edge of the rotating semiconductor wafer for grinding the peripheral edge of the semiconductor wafer, the edge portion of the peripheral edge of the semiconductor wafer is ground in a state where the rotary axis of the semiconductor wafer and the rotary axis of the grindstone are kept in parallel to each other, while the grindstone is reciprocatingly moved along the inclined surface of the grindstone.

Further, the present invention is characterized in that the outer peripheral surface of the semiconductor wafer is ground by the peripheral surface of the grindstone disposed in parallel to the axis, while the grindstone is reciprocatingly moved along the direction of the rotary axis of the wafer.

According to the present invention, the peripheral edge of the semiconductor wafer is ground while the grindstone is reciprocatingly moved along the inclined surface of the grains is inclined to the circumferential direction of the wafer and the grinding is performed while the grindstone is reciprocatingly moved along the rotary axis of the wafer, so that the ground surface at the peripheral edge of the semiconductor wafer becomes smooth and the deformation of the grinding surface of the grindstone itself is reduced, to thereby extend the service life of the grindstone.

BRIEF DESCRIPTION OF THE DRAWINGS

The exact nature of this invention, as well as other object and advantages thereof, will be readily apparent from consideration of the following specification relating the accompanying drawings, in which like reference characters designate the same or similar parts throughout the figures thereof and wherein.

DESCRIPTION OF THE PREFERRED EMBODIMENT

Detailed description will hereunder be given of the preferred embodiment of a method of chamfering a semiconductor wafer according to the present invention with reference to the accompanying drawings.

Figure 1:
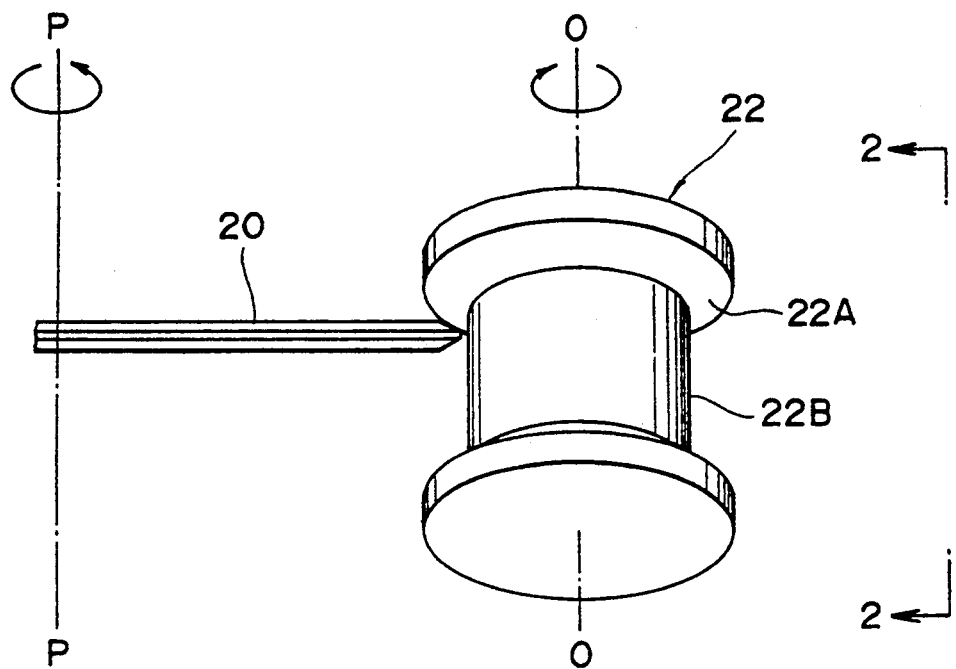
FIG. 1 is a front view showing the method of chamfering according to the present invention.

A wafer 20 shown in FIG. 1 is held by the well-known clamping mechanism or sucking mechanism, not shown, and rotatable about an axis P—P at 1~2 r.p.m. for example. On the other hand, a grindstone 22 is formed of a grindstone with a groove, and an inclined surface 22A forming the side surface of the groove of the grindstone 22 and a peripheral surface forming the bottom surface of the groove of the grindstone 22 constitute a grinding surface. This grindstone 22 is rotatable about an axis O—O at 2500 r.p.m. for example, in the same direction as the wafer 20 or in the reverse direction thereof.

Figure 2:
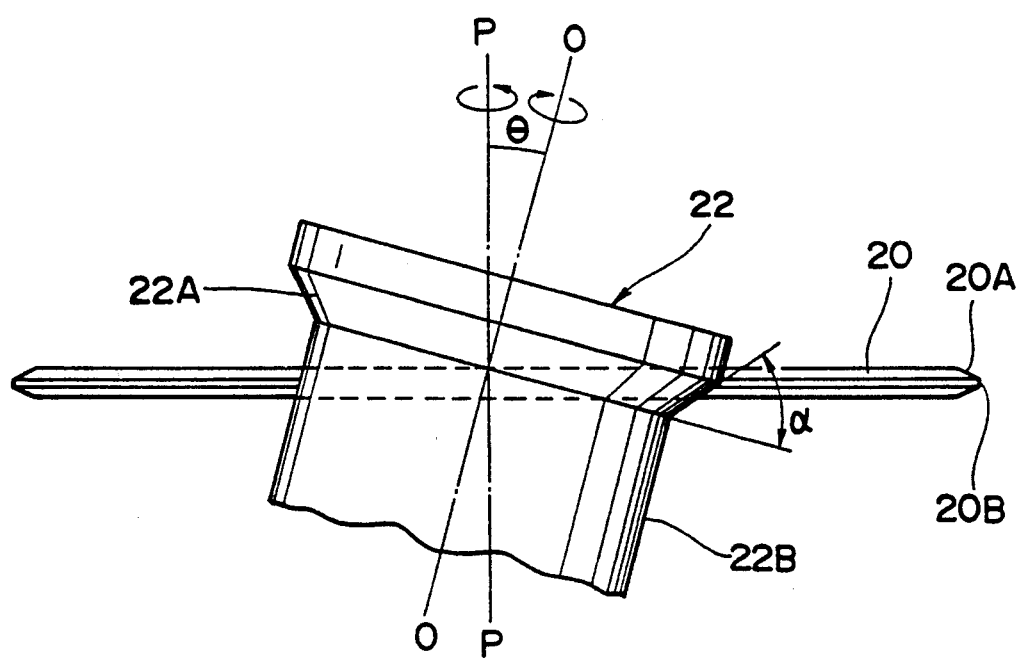
FIG. 2 is a view in the direction indicated by the arrows from the line 2—2 in FIG. 1.
Figure 3:
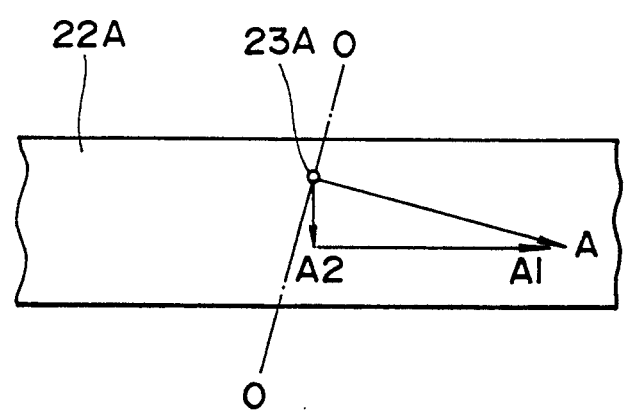
FIG. 3 is an explanatory view showing the moving direction of the abrasive grains according to the present invention.

As shown in FIG. 2, the rotary axis O—O of the grindstone 22 is inclined through an angle $\theta$ to the rotary axis P—P of the wafer 20. That is, the grindstone 22 is inclined through the angle $\theta$ to the direction of the tangent line of the wafer 20, and, in this state, the grindstone 22 chamfers an edge portion 20A at the peripheral edge of the wafer 20. When chamfering is performed in this state, a moving direction A of the abrasive grains 23A of the grindstone 22 takes a direction perpendicular to the rotary axis O—O of the grindstone 22 as shown in FIG. 3, whereby the moving direction A is inclined to the chamfered surface 20A of the wafer 20. Accordingly, the moving direction A of the abrasive grains 23A is divided into two including a component force $A_1$ in the grinding direction and a component force $A_2$ in the perpendicular direction, and these component forces act on the grinding of a chamfered surface 20A of the semiconductor wafer. According to the present invention, in a special work of the chamfering of the semiconductor wafer, the inclined angle $\theta$ and an angle $\alpha$ of the grindstone are determined and the chamfering at a predetermined angle is performed. That is, by inclining the grindstone to chamber the wafer, whereby the same movement as that in the ordinary method of inclined grinding can be offered. When the grinding is performed in this state, the number of acting abrasive grains is increased, so that the surface accuracy of the ground surface can be improved owing to the averaging effect of the acting abrasive grains.

The shaft of the grindstone is inclined in the above embodiment, however, the shaft of the wafer may be inclined.

Furthermore, an outer peripheral surface 20B of the wafer 20 is ground by the bottom surface of the groove 22B of the grindstone 22 which is inclined through the angle $\theta$, and, in this case too, the number of the acting abrasive grains is increased, so that the satisfactory ground surface can be obtained.

As described above, according to the method of chamfering the semiconductor wafer of the present invention, the grinding is performed with the axis of the grindstone being inclined to the rotary axis of the semiconductor wafer, so that the ground surface having the satisfactory accuracy can be obtained and the service life of the grindstone can be extended.

Figure 4:
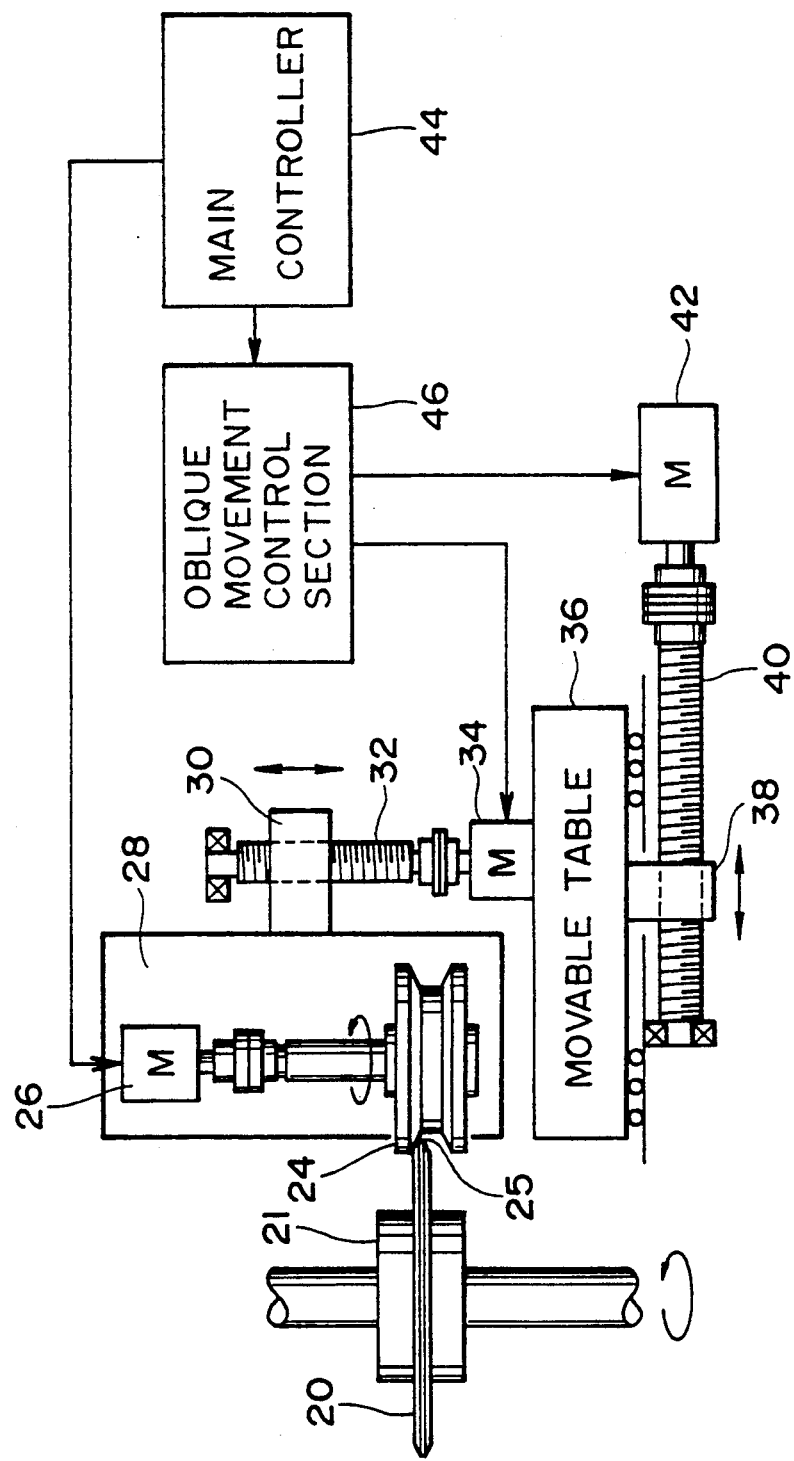
FIG. 4 is a block diagram showing the chamfering device for performing the method of chamfering the wafer according to the present invention.

The wafer 20 shown in FIG. 4 is held by the well-known clamping mechanism or sucking mechanism, and rotatable at 1~2 r.p.m. for example. On the other hand, a grindstone 24 is formed of a grindstone with a groove, and an inclined surface 25 forming the side surface of the groove of the grindstone 24 constitutes a grinding surface. This grindstone 24 is rotatable by a motor 26 at 2500 r.p.m. for example, in the same direction as the wafer 20, or in the reverse direction thereof.

Figure 5:
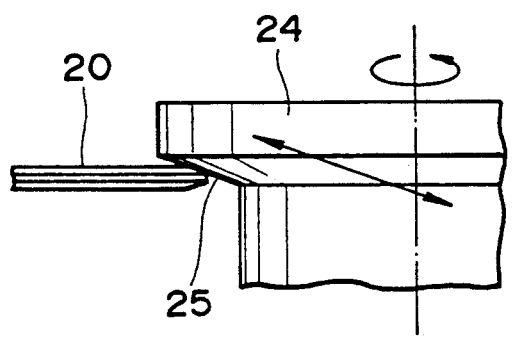
FIG. 5 is an explanatory view showing the method of chamfering the wafer according to the present invention.
Figure 7:
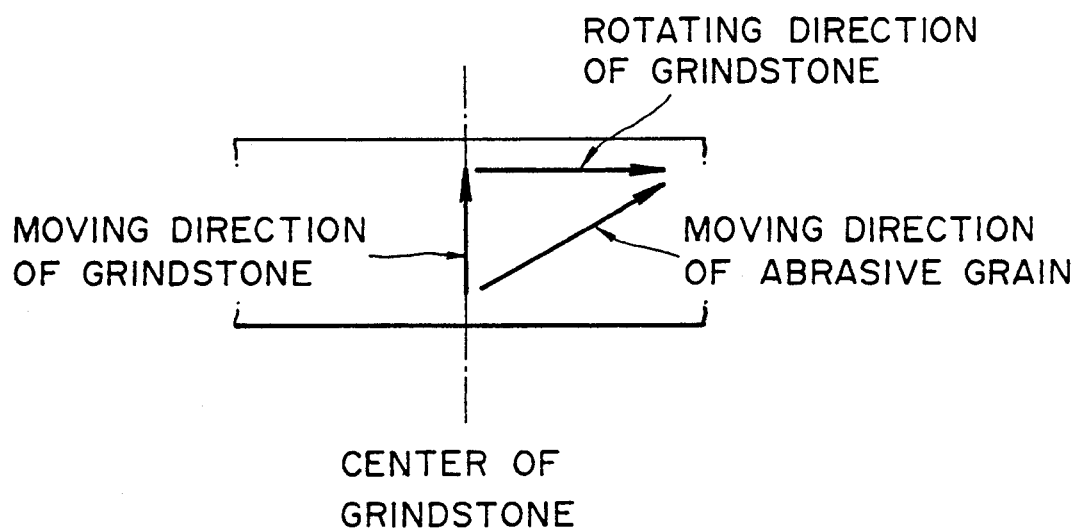
FIG. 7 is an explanatory view showing the movement of the abrasive grains in the method of chamfering the wafer according to the present invention.
Figure 8:
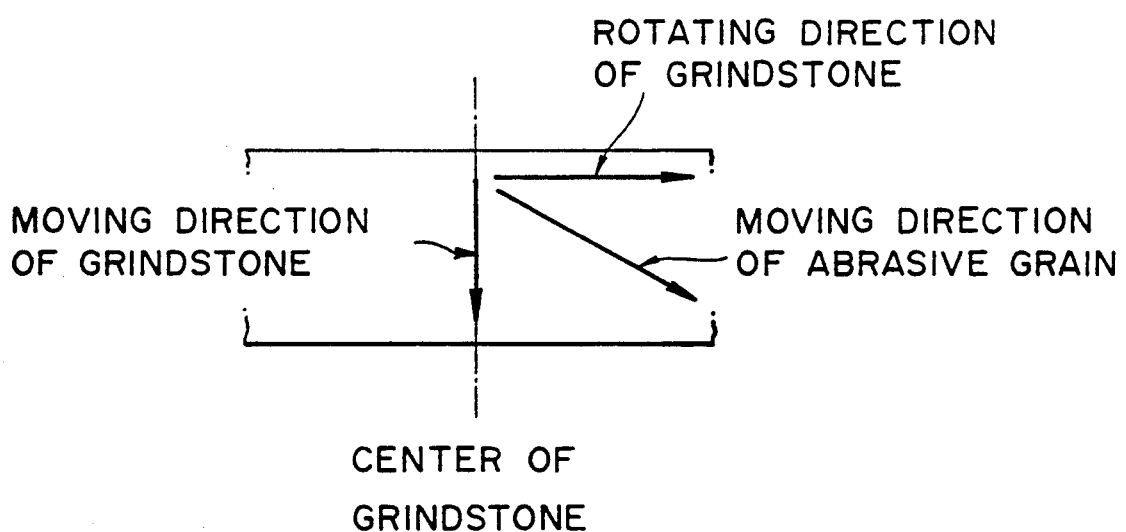
FIG. 8 is an explanatory view showing the conventional method of chamfering the semiconductor wafer.
Figure 9:
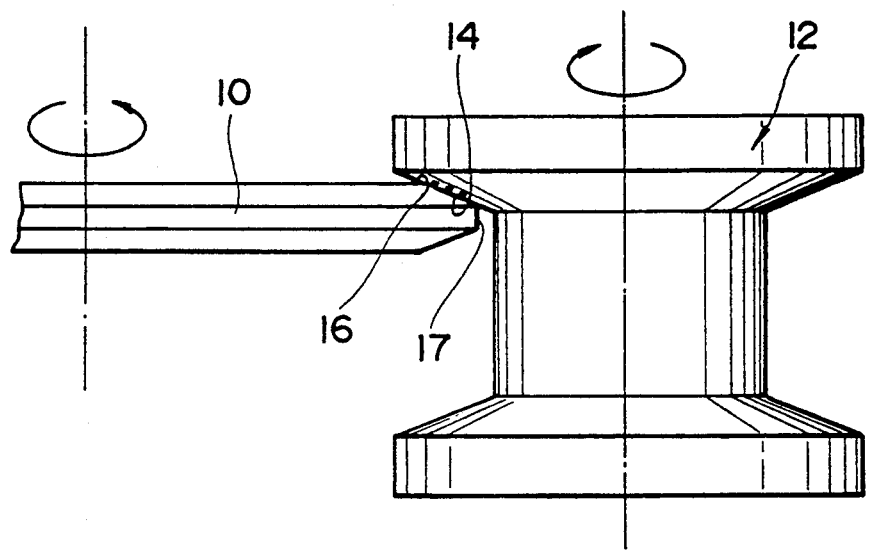
FIG. 9 is an explanatory view showing the moving direction of the abrasive grains in the conventional method of chamfering the semiconductor wafer.
Figure 10:
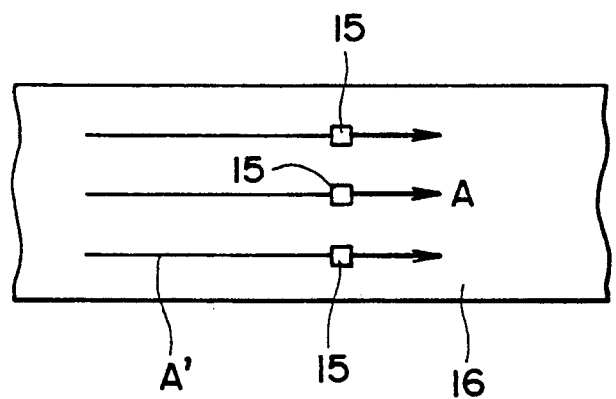
FIG. 10 is an explanatory view showing the moving direction of the abrasive grains in the conventional method of chamfering the semiconductor wafer.

Further, the grindstone 24 is reciprocatingly moved along an inclined surface 25 as indicated by arrow marks shown in FIG. 5. The above-described reciprocating movement in the direction of inclination can be achieved by combining the well-known vertically moving mechanism with the well-known horizontally moving mechanism. That is, the grindstone 24 is supported by a support plate 28 whose nut portion 30 is threadably coupled to a screw shaft 32. Accordingly, when the screw shaft 32 is rotated by the driving of a motor 34, the support plate 28 is vertically moved and the grindstone 24 is vertically moved as well. Furthermore, the motor 34 is supported by a movable table 36 whose nut portion 38 is threadably coupled to a screw shaft 40. Accordingly, when the screw shaft 40 is rotated by the driving of a motor 42, the table 36 is moved in the horizontal direction and the grindstone 24 is horizontally moved as well. Designated at 44 is a main controller and 46 an oblique movement control section. The main controller 44 controls the driving of the motor 26 and controls the oblique movement control section 46 as well. The motors 34 and 42 are controlled by the oblique movement control section 46 to reciprocatingly move the grindstone in the oblique direction. When the grindstone 22 is ground during the reciprocating movement thereof along the inclined surface 25, the moving direction of the abrasive grains becomes one shown in FIG. 7 during the obliquely upward movement of the grindstone 24, and the moving direction of the abrasive grains becomes one shown in FIG. 8 during the oblique downward movement of the grindstone 24.

With these operations, the moving direction of the abrasive grains is inclined to the circumferential direction of the wafer and the number of the acting abrasive grains of the grindstone is increased, so that the surface accuracy of the ground surface can be improved owing to the averaging effect of the acting abrasive grains.

Figure 6:
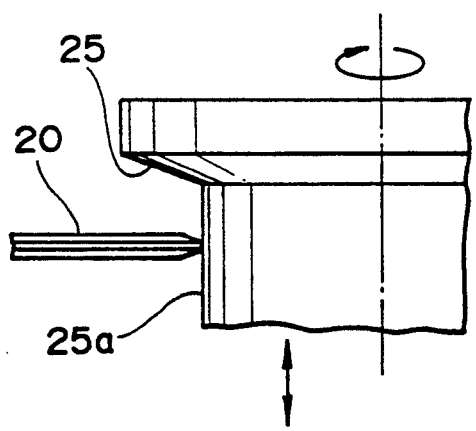
FIG. 6 is an explanatory view showing the moving direction of the abrasive grains in the method of chamfering the wafer according to the present invention.

Furthermore, as shown in FIG. 6, the grindstone 24 is reciprocatingly moved as indicated by arrow marks in FIG. 6 along a surface 25a contacting the outer periphery of the wafer (the peripheral surface of the grindstone in parallel to the rotary axis of the wafer). An embodiment of this reciprocating movement may be shown by the above-described example of the mechanism.

The grindstone is reciprocatingly moved in the above embodiment, however, the wafer may be reciprocatingly moved.

As has been described hereinabove, according to the method of chamfering the semiconductor wafer of the present invention, the grinding is performed with the grindstone being reciprocatingly moved along the inclined surface of the grindstone, so that the ground surface having the satisfactory accuracy can be obtained and the service life of the grindstone can be extended.

It should be understood, however, that there is no intention to limit the intention to the specific forms disclosed, but on the contrary, the invention is to cover all modifications, alternate constructions and equivalents falling within the spirit and scope of the invention as expressed in the appended claims.

We claim:

1. A method of chamfering a semiconductor wafer, wherein a rotating grindstone is abutted against a peripheral edge of the rotating semiconductor wafer for grinding the peripheral edge of the semiconductor wafer, characterized in that the peripheral edge of the semiconductor wafer is ground with a rotary axis of the grindstone being inclined in a direction of a line tangent to a cylindrical peripheral edge of the semiconductor wafer in a plane perpendicular to a rotary axis of the semiconductor wafer, the rotary axis of the grindstone and the rotary axis of the semiconductor wafer being located in different planes.

2. The method of chamfering the semiconductor wafer as set forth in claim 1, wherein said grindstone is formed of a grindstone with a groove and the grinding surfaces of said grindstone are an inclined surface forming the side portion of the groove of said grindstone and the outer peripheral surface forming the bottom surface of the axial groove.

3. A method of chamfering a semiconductor wafer, wherein a rotating grindstone is abutted against the peripheral edge of a rotating semiconductor wafer for grinding the peripheral edge of the semiconductor wafer, characterized in that an edge portion of the peripheral edge of the semiconductor wafer is ground while said grindstone is reciprocatingly moved in a direction inclined relative to a rotary axis of the grindstone and along an inclined surface of said grindstone, wherein a rotary axis of the semiconductor wafer and the rotary axis of said grindstone are kept parallel to each other.

4. The method chamfering the semiconductor wafer as set forth in claim 3, characterized in that the outer peripheral surface at the peripheral edge of the semiconductor wafer is ground by the peripheral surface of the grindstone disposed in parallel to the rotary axis of the grindstone while the grindstone is reciprocatingly moved along the direction of the axis.

* * * * *